United States Patent
Gediga et al.

(10) Patent No.: US 8,994,438 B2
(45) Date of Patent: Mar. 31, 2015

(54) CIRCUIT ARRANGEMENT FOR SWITCHING A CURRENT, AND METHOD FOR OPERATING A SEMICONDUCTOR CIRCUIT BREAKER

(75) Inventors: Swen Gediga, Höchstadt/Aisch (DE);
Karsten Handt, Burgthann (DE);
Rainer Sommer, Heroldsbach (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 14/233,575

(22) PCT Filed: Jul. 12, 2012

(86) PCT No.: PCT/EP2012/063648
§ 371 (c)(1),
(2), (4) Date: Jan. 17, 2014

(87) PCT Pub. No.: WO2013/010898
PCT Pub. Date: Jan. 24, 2013

(65) Prior Publication Data
US 2014/0145779 A1 May 29, 2014

(30) Foreign Application Priority Data
Jul. 21, 2011 (DE) .......................... 10 2011 079 552

(51) Int. Cl.
*H03K 17/14* (2006.01)
*H03K 17/082* (2006.01)

(52) U.S. Cl.
CPC ............ *H03K 17/14* (2013.01); *H03K 17/0828* (2013.01)

USPC ............................ 327/378; 327/108; 327/434

(58) Field of Classification Search
USPC ......................................... 327/108, 378, 434
See application file for complete search history.

(56) References Cited

U.S. PATENT DOCUMENTS 5,917,165 A    6/1999   Goetz
(Continued)

FOREIGN PATENT DOCUMENTS

DE       197 45 040 A1     8/1998
DE       102 11 075 A1    10/2003
(Continued)

OTHER PUBLICATIONS

A Novel Gate Drive Circuit for Low-loss System Using iGBT Saturation Voltage Characteristics; Proceedings 2001 International Symposium on Power Semiconductor Devices & ICs, Osaka, Seiten 377 bis 380 Satoki Takizawa, Seiki Igarashi, Kazuo Kuroki; 2001.

*Primary Examiner* — John Poos
*Assistant Examiner* — David Mattison
(74) *Attorney, Agent, or Firm* — Henry M Feiereisen LLC

(57) ABSTRACT

A control voltage is generated at a control input of a semiconductor circuit breaker by an actuation circuit at switching flanks of a switching signal, said control voltage having a profile which is flattened in relation to the profile of the switching signal. With the disclosed method, the switching losses in a semiconductor circuit breaker are reduced. By defining a value for a switching parameter of a control device of the actuation circuit, the switching behavior of the actuation circuit can be influenced by the switching parameter. A specific parameter value of the switching parameter can be varied during operation of the actuation circuit.

11 Claims, 11 Drawing Sheets

(56) References Cited

U.S. PATENT DOCUMENTS

| | | |
|---|---|---|
| 6,476,683 B1 | 11/2002 | Li |
| 7,019,507 B1 | 3/2006 | Dittmer |
| 7,315,439 B2 * | 1/2008 | Muenzer et al. ............ 361/91.1 |
| 2005/0099751 A1 * | 5/2005 | Kumagai ..................... 361/100 |
| 2008/0232144 A1 | 9/2008 | Klein |

FOREIGN PATENT DOCUMENTS

| | | |
|---|---|---|
| DE | 10 2004 020 273 A1 | 11/2005 |
| EP | 0 066 881 A2 | 12/1982 |
| EP | 0 600 751 A2 | 6/1994 |
| WO | WO 00/52657 A1 | 9/2000 |
| WO | WO 2008/032113 A1 | 3/2008 |

* cited by examiner

CIRCUIT ARRANGEMENT FOR SWITCHING A CURRENT, AND METHOD FOR OPERATING A SEMICONDUCTOR CIRCUIT BREAKER

CROSS-REFERENCES TO RELATED APPLICATIONS

This application is the U.S. National Stage of International Application No. PCT/EP2012/063648, filed Jul. 12, 2012, which designated the United States and has been published as International Publication No. WO 2013/010898 and which claims the priority of German Patent Application, Serial No. 10 2011 079 552.9, filed Jul. 21, 2011, pursuant to 35 U.S.C. 119(a)-(d).

BACKGROUND OF THE INVENTION

The invention relates to a circuit arrangement for switching a current as a function of a predefined switching signal. The circuit arrangement comprises a semiconductor circuit breaker for switching a current and an actuation device for the semiconductor circuit breaker. The actuation device is so designed as to receive the switching signal and to generate a control voltage at a control input of the semiconductor circuit breaker as a function of the received switching signal.

A circuit arrangement of this type is disclosed in WO 2008/032113A1. Such a circuit arrangement may be provided e.g. in a controlled converter which can be used to operate a three-phase machine.

The way in which a controlled converter functions is explained in greater detail below with reference to FIG. 1. Alternating currents I1, I2, I3, which together form a three-phase current that can be used to operate an electrical machine 18, can be generated in phase conductors 12, 14, 16 by means of a converter 10 using a direct voltage Uzk. The direct voltage Uzk may be provided e.g. between two conductor rails ZK+, ZK− of an intermediate circuit of a frequency converter. For the purpose of generating the alternating currents I1, I2, I3, the phase conductors 12, 14, 16 are connected to the conductor rails ZK+, ZK− via a halfbridge 20, 22, 24 in each case as shown in FIG. 1. The way in which the alternating currents I1, I2, I3 are generated is explained below with reference to the halfbridge 20. This explanation applies likewise to the alternating currents I2 and I3 in connection with the halfbridges 22 and 24.

The halfbridge 20 has two semiconductor circuit breakers 26, 28, each of which respectively has a transistor Tr1 or Tr2 and a diode V1 or V2 which is antiparallel connected to the respective transistor. The phase conductor 12 is connected once to the plus conductor rail ZK+ and once to the minus conductor rail ZK− via the semiconductor circuit breakers 26, 28. The transistors Tr1, Tr2 can be e.g. IGBTs (insulated gate bipolar transistors) or MOSFETs (metal oxide semiconductor field effect transistors). The semiconductor circuit breakers 26, 28 are connected to a control unit 34 via a control line 30, 32 in each case. The control unit 34 generates a clock signal 36, which is transmitted via the control line 30 to the semiconductor circuit breaker 26. The transistor Tr1 of the semiconductor circuit breaker 26 is switched alternately into conducting and a blocking state by means of the clock signal 36. The control unit 34 transmits a push-pull signal to the semiconductor circuit breaker 28 via the other control line 32, such that the transistor Tr2 of the semiconductor circuit breaker 28 is switched in counter-phase with the transistor Tr1. The alternate switching of the transistors Tr1 and Tr2 generates an alternating voltage in the phase conductor 12 and hence the alternating current I1. In order to generate the three-phase current, the control unit 34 correspondingly transmits phase-offset clock signals to circuit breakers of the other halfbridges 22 and 24 via further control lines. An alternating voltage which is generated by the electrical machine 18 can be rectified by means of the diodes of the semiconductor circuit breakers.

The clock signals which are generated by the control unit 34, e.g. the clock signal 36, are not normally present in a form that can be used to switch a semiconductor circuit breaker. Therefore an actuation circuit 40 is connected ahead of a control input 38 of the semiconductor circuit breaker 26 and generates a control voltage at the control input 38 by means of a driver circuit (not shown) as a function of the clock signal 36. In the case of a transistor, the control input 38 is the gate or base thereof. In the same way, a corresponding actuation circuit is connected ahead of the semiconductor circuit breaker 28 and corresponding actuation circuits are connected ahead of the circuit breakers of the bridges 22 and 24.

When a current is switched by means of e.g. the semiconductor circuit breaker 26, it must be considered that a voltage might be induced as a result of inductance (not shown in FIG. 1) in the circuit, depending on how fast the semiconductor circuit breaker 26 is switched from a conducting state to a blocking state. This induction voltage is then superimposed on the operating voltage, such that a resulting value of the voltage dropping over the semiconductor circuit breaker 26 may be higher than a maximal permitted value. Consequently, components of the semiconductor circuit breaker 26 may be damaged. Provision can therefore be made for a control voltage having a flattened profile, in relation to the profile of the switching signal 36, to be generated at the control input 38 by the actuation circuit 40, at least in the case of those switching edges of the switching signal 36 which are used to block the semiconductor circuit breaker 26.

In order to obtain a control voltage which has a flattened profile, the teaching of publication WO 2008/032113 A1 relates to measuring a current flowing through the power semiconductor and determining an extreme point (a maximum or a minimum) in the temporal profile of the current strength during a switching action. Until the extreme point is reached, a control voltage is varied only slowly at the control input of the power semiconductor, such that a ramp-like profile of the control voltage is produced and a conductivity of the power semiconductor only changes relatively slowly. After the extreme point is reached, the control voltage then switches abruptly to its final value.

One disadvantage of such a solution is that the switching losses in the power semiconductor are very high for the period during which the control voltage is reduced only slowly with a ramp-like profile.

SUMMARY OF THE INVENTION

The object of the present invention is to reduce the switching losses in such a semiconductor circuit breaker.

According to one aspect of the invention, the object is achieved by a circuit arrangement having a semiconductor circuit breaker and an actuation device configured to generate, based on a switching signal, a control voltage having a temporal profile at a control input, as a result of which at least one predetermined operating variable of the semiconductor circuit breaker satisfies a predetermined criterion during a switching action, wherein the criterion is predefined by a switching parameter of the actuation device and a parameter value of the switching parameter which can be varied during operation of the circuit arrangement.

According to another aspect of the invention, the object is achieved the by a method for controlling a semiconductor circuit breaker with a switching signal generated by a signal generating device and with a control voltage generated by an actuation device, which method includes the steps of determining an an operating state of the semiconductor circuit breaker and establishing at least one parameter value of a switching parameter of the actuation device, generating a switching signal and transmitting the switching signal to the actuation device, and generating a control voltage at a control input of the semiconductor circuit breaker as a function of the switching signal, wherein a temporal profile of a voltage value of the control voltage is established such that, during a switching action, the operating variable satisfies the criterion defined by the parameter value.

Advantageous developments of the inventive circuit arrangement and of the inventive method are specified in the subclaims.

The inventive circuit arrangement can be used to switch a current as a function of a switching signal which can be predefined. For this purpose, the circuit arrangement has an actuation device which is so designed as to receive the switching signal and to actuate a semiconductor circuit breaker as a function of the received switching signal. In the context of the converter described above, the actuation device may take the form of e.g. an actuation circuit for the semiconductor circuit breaker, wherein said actuation circuit receives the switching signal from the microcontroller.

A current can be switched in a controlled manner by means of the semiconductor circuit breaker. In order to vary the current strength of the current in accordance with the switching signal, the actuation device generates a control voltage at a control input of the semiconductor circuit breaker as a function of the received switching signal. In this case, a temporal profile of the control voltage is predefined such that at least one predetermined operating variable of the semiconductor circuit breaker, e.g. a collector-emitter voltage of an IGBT, satisfies a predetermined criterion during a switching action. Simply switching abruptly and lastingly between a conducting state and a blocking state of the semiconductor circuit breaker therefore does not occur. Instead, a temporal profile of the operating variable during the transition between the two switching states (conducting and blocking) is taken into consideration, and a switching action is e.g. extended by a corresponding profile of the control voltage in order to restrict an induction voltage.

An operating variable can be e.g. a voltage dropping over a transistor and/or a diode of the semiconductor circuit breaker, or a gradient of a temporal profile of this voltage. A gradient of a temporal profile of the current to be switched can be likewise be taken into consideration as an operating variable during the switching.

As a criterion for the operating variable, it can be predefined e.g. that the operating variable should assume a specific desired value during the switching. Likewise, it can be predefined that the operating variable should not exceed or fall below a specific limit value.

In the circuit arrangement according to the invention, the criterion, which may be e.g. a specific desired value or a specific limit value, is established by a switching parameter of the actuation device. A specific parameter value of the switching parameter can be varied during operation of the circuit arrangement in this case. With reference to the examples, the desired value or the limit value can therefore be varied during operation. The switching behavior of the inventive circuit arrangement can therefore be selectively changed by varying a specific parameter value during the operation, and adapted to a current operating state of the semiconductor circuit breaker. It is therefore no longer necessary to permanently adapt the switching behavior in such a way that induction of an unacceptably high voltage as a result of inductances is always prevented for a worst-case condition. This is based on the knowledge that the switching duration need only be extended if a high induction voltage is actually expected. In all other cases, the current to be switched can be rapidly interrupted. This avoids those switching losses which occur in the case of a delayed transition, e.g. when using a ramp-like profile of the control voltage.

It is also known that the maximal permitted voltage over the semiconductor circuit breaker is dependent on the temperature thereof. A specific type of semiconductor circuit breaker may be e.g. particularly voltage resistant when it is relatively warm. A shorter switching duration is possible in this case if corresponding parameter values are predefined.

The statements made above in respect of the interruption of the current obviously also apply to connection of the same.

The inventive method provides for controlling a semiconductor circuit breaker by means of a signal generating device which generates a switching signal, and an actuation device which generates a control voltage for the semiconductor circuit breaker as a function of the switching signal. In order to switch the semiconductor circuit breaker, the switching signal is generated by means of the signal generating device and transmitted to the actuation device. The latter receives the switching signal and generates a control voltage at a control input of the semiconductor circuit breaker as a function of the switching signal. An operating state of the semiconductor circuit breaker is determined first, however, and at least one parameter value of a switching parameter of the actuation device is established as a function of the determined operating state. The parameter value of the switching parameter is then used to establish a criterion for an operating variable of the semiconductor circuit breaker during a switching action of the semiconductor circuit breaker. During the switching action, a control voltage having a temporal profile of the voltage value is then generated such that the operating variable satisfies the criterion which is predefined by the parameter value.

In an advantageous embodiment, the inventive circuit device has a measuring device for capturing at least one operating variable. This measured operating variable need not necessarily be the same as is subsequently taken into consideration during the switching. For example, a temperature of a transistor of the semiconductor circuit breaker or a temperature of a diode (which is antiparallel connected to the transistor) of the semiconductor circuit breaker can be measured. With regard to semiconductor components, the blocking ability and the switching behavior are often dependent on the temperature. A limit value for the voltage dropping over the semiconductor circuit breaker can therefore be predefined on the basis of a known temperature. The current operating state of the semiconductor circuit breaker is known by means of measuring the operating variable, and a suitable value for the switching parameter can be established.

According to a further development of the inventive circuit arrangement, a current strength of a current flowing through the semiconductor circuit breaker is measured. This has the advantage that it can be determined, on the basis of the measured value, whether there is actually a risk of an unacceptably high voltage occurring if the semiconductor circuit breaker is blocked (or opened) rapidly.

Provision can also be made for a voltage dropping over the semiconductor circuit breaker, e.g. a collector-emitter voltage of a transistor, to be measured by means of the measuring device. With reference to this operating variable, it is then possible e.g. to identify how close the semiconductor circuit breaker already is to a maximal permitted blocking voltage value and consequently how high an induced voltage can possibly be. The semiconductor circuit breaker can then be switched correspondingly rapidly (or slowly).

Provision can also be made for the measuring device to determine an average value over time for one of the above variables. Any disruptive influence of short-term load peaks on the measurement can be limited thereby.

Instead of a measurement, provision can also be made for determining an operating variable of the semiconductor circuit breaker, in particular a temperature thereof, on the basis of a numeric model as a function of at least one other operating variable. In this case, it is not necessary to provide an additional sensor for measuring the first-cited operating variable.

In an embodiment of the inventive circuit arrangement, the actuation device is so designed as to establish the parameter value automatically as a function of an operating state of the semiconductor circuit breaker, in particular on the basis of a characteristic curve. This has the advantage that an apparatus in which the inventive circuit arrangement will be used does not have to be adapted to the effect that it can determine a parameter value for the actuation device. The actuation device is then able to do this itself. The use of a characteristic curve (or a plurality thereof) has the advantage that, in the context of the circuit arrangement, the type of semiconductor circuit breaker can easily be taken into consideration when determining the parameter value because a suitable characteristic curve is stored in the actuation device.

In a further development, the actuation device is so designed as to receive the parameter value for a predetermined switching parameter with the switching signal via a control line. This has the advantage that the switching behavior can be adapted in advance to a future sequence of switching instructions.

The two possibilities described above for determining a parameter value can also be combined. One parameter value may therefore be specified by the actuation device for one of the switching parameters, while another parameter value for another of the switching parameters may be received by the actuation device with the switching signal from the outside.

In a further advantageous development of the inventive circuit arrangement, the actuation device is so designed as to receive a digital signal via a switching input using a fault-tolerant transmission protocol and/or to send a digital signal via a measuring output using a fault-tolerant transmission protocol. It is thereby possible to prevent the switching behavior of the circuit arrangement being adversely influenced as a result of electromagnetic interference.

BRIEF DESCRIPTION OF THE DRAWING

The invention is explained in greater detail below with reference to exemplary embodiments, wherein.

DETAILED DESCRIPTION OF PREFERRED EMBODIMENTS

The examples represent preferred embodiments of the invention.

Figure 1:
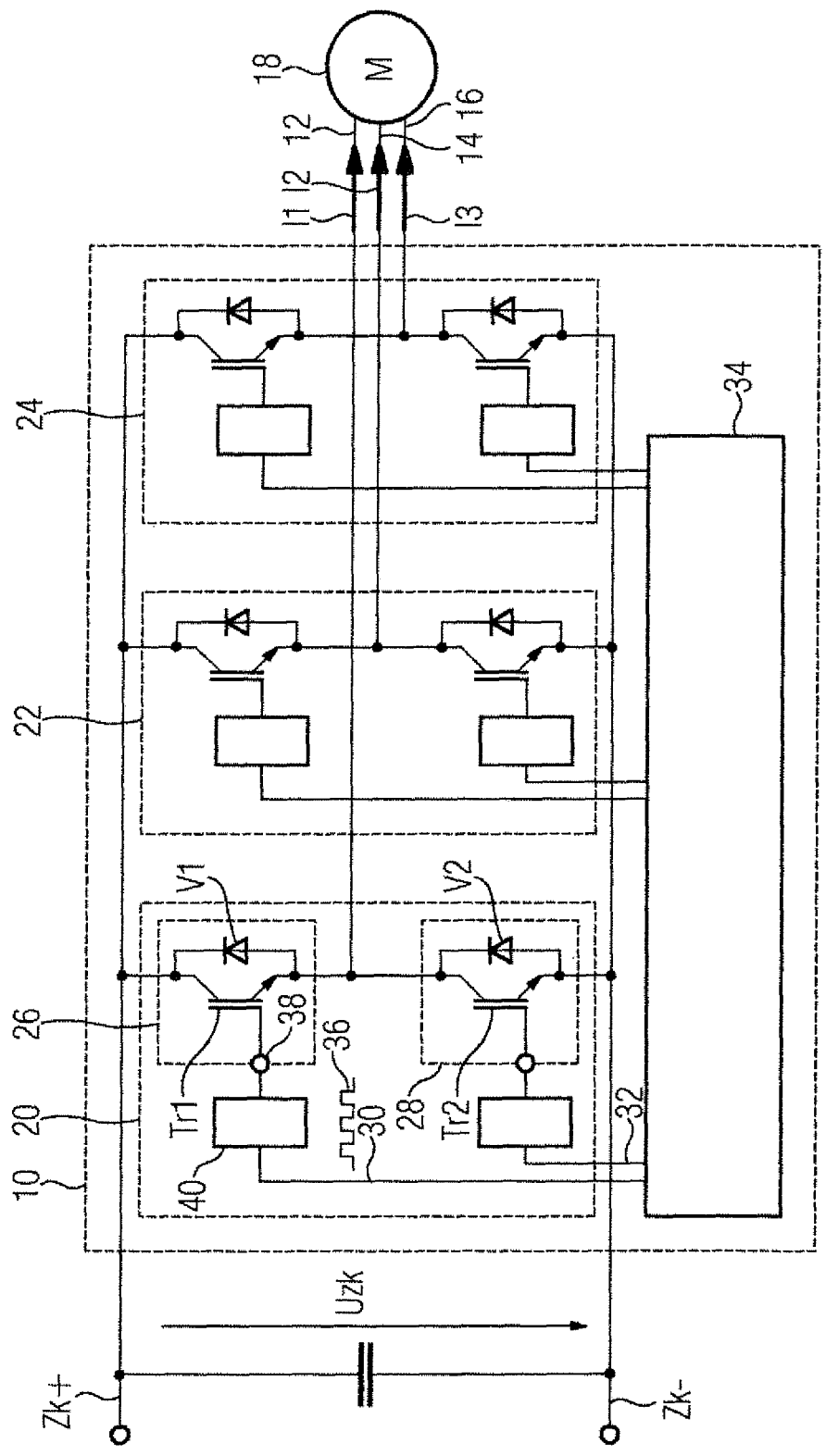
FIG. 1 shows a schematic illustration of a basic structure of a converter.
Figure 2:
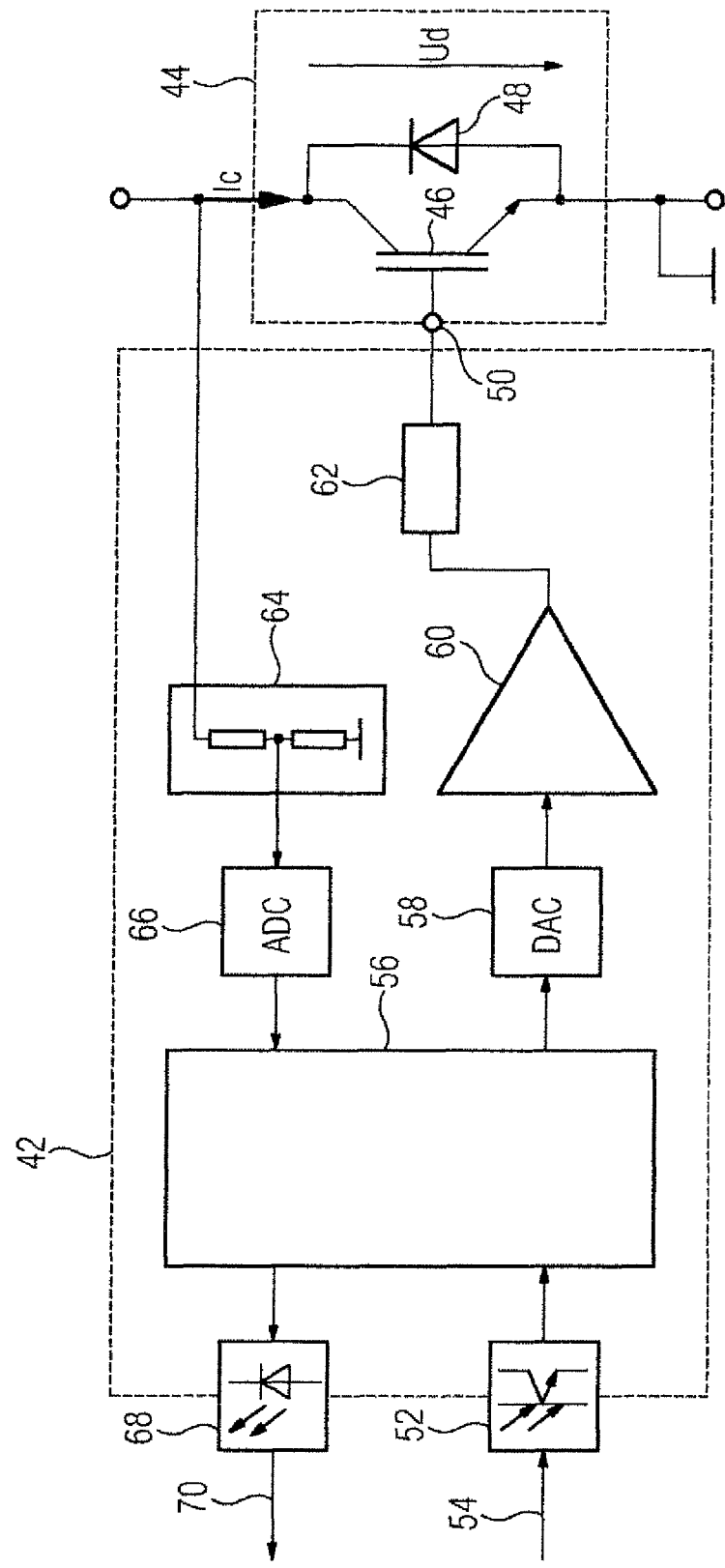
FIG. 2 shows a schematic illustration of an actuation circuit and a semiconductor circuit breaker, which together form an embodiment of the inventive circuit arrangement.

FIG. 2 shows an actuation circuit 42 which is integrated into a controlled converter (not shown in further detail in FIG. 2) of a frequency converter. A structural design of the converter can correspond to that of the converter 10. The actuation circuit 42 controls a semiconductor circuit breaker 44. This has a transistor 46 (here an IGBT) and a diode 48 which is antiparallel connected to the transistor 46. A MOSFET, for example, can also be provided instead of the IGBT. In order to control the semiconductor circuit breaker 44, the actuation circuit 42 generates a control voltage at a control input 50 of the semiconductor circuit breaker 44. The control input 50 here corresponds to the gate of the IGBT 46. The actuation circuit 42 and the semiconductor circuit breaker 44 together represent an embodiment of the inventive circuit arrangement. A current Ic is controlled by means of the semiconductor circuit breaker 44.

The control voltage is generated as a function of a switching signal which is received by the actuation circuit 42 via an optical receiver or input optocoupler 52, by means of which the actuation circuit 42 is connected to a signal line 54 of a converter controller (not shown). The converter controller is a signal-generating device of the converter and similar to the control unit 34 described above.

The switching signal is evaluated by a programmable control device 56. The control device can be provided by an FPGA (field-programmable gate array) or an ASIC (application-specific integrated circuit), for example. By means of the switching signal, the converter controller predefines whether the semiconductor circuit breaker 44 should be in a conducting state or a blocking state. The control device 56 generates a corresponding digital signal, which is used by a digital-analog converter 58 to generate an analog signal. The analog signal is amplified by an amplifier circuit 60 and transmitted to the control input 50 via a gate resistance 62 as a control voltage.

A digital filter or digital regulator may be provided in the control device 56 for the purpose of generating a digital signal, which is suitable for actuating the semiconductor circuit breaker 44, from the switching signal of the reswitching circuit. Protection functions can also be provided, e.g. for the semiconductor circuit breaker 44. The control device 56 represents a digital interface between the converter controller and the semiconductor circuit breaker 44.

The actuation circuit 42 has a voltage measuring device 64, by means of which the collector-emitter voltage Uce of the transistor 46 is captured. This simultaneously corresponds to the diode voltage Ud here. The captured voltage value is converted by an analog-digital converter 66 into a digital measured value, which is evaluated by the control device 56. The diode voltage Ud represents an operating variable of the semiconductor circuit breaker 44.

In the context of the actuation circuit 42, data such as e.g. digital measured values or state information can be transmitted to the converter controller via an optical transmitter or output optocoupler 68 and a signal line 70.

In the context of the actuation circuit 42, provision can also be made for using a fault-tolerant transmission protocol to exchange data between the converter controller and the control device 56 such that, even if the data is corrupted by e.g. electromagnetic interference, the information originally sent can be reconstructed from the corrupted data (up to a specific level of corruption). Examples of such a transmission protocol include a Barker code and a cyclical code.

If a change in the switching state of the semiconductor circuit breaker 44, i.e. from conducting to blocking or vice versa, is predefined by the converter controller by means of the switching signal on the control line 54, the actuation circuit 42 effects a corresponding switching action by varying the control voltage at the control input 50. In this case, the switching behavior of the actuation circuit 42 is specified by switching parameters of the control device 56, wherein the switching parameter values may be varied during the operation of the actuation circuit 42. In the context of the actuation circuit 42, the values for the switching parameters can be transmitted with the switching signal from the converter controller via the control line 54 to the control device 56.

Figure 3:
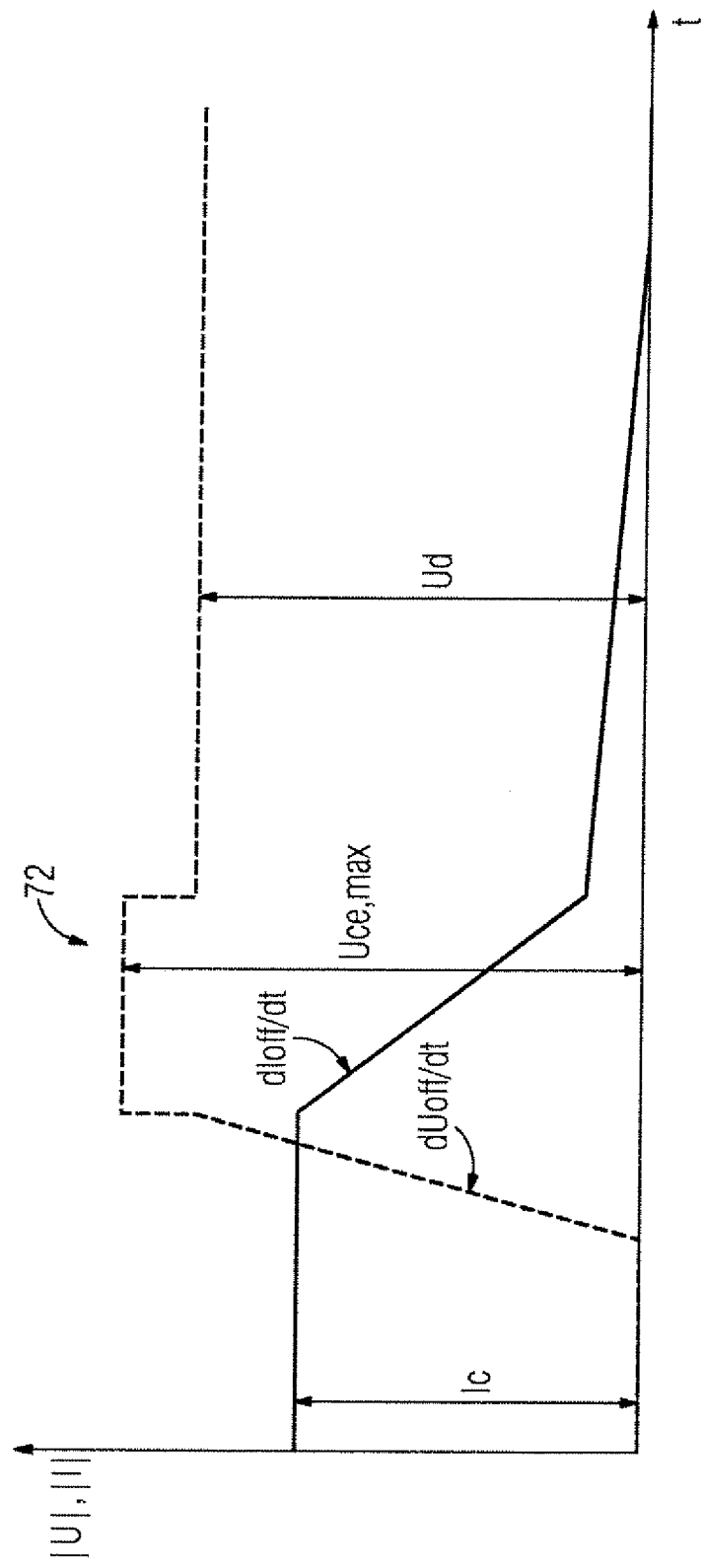
FIG. 3 shows a diagram in which it is possible to see the influence, on a turn-off action, of switching parameters which can be set by the actuation circuit from FIG. 2.
Figure 4:
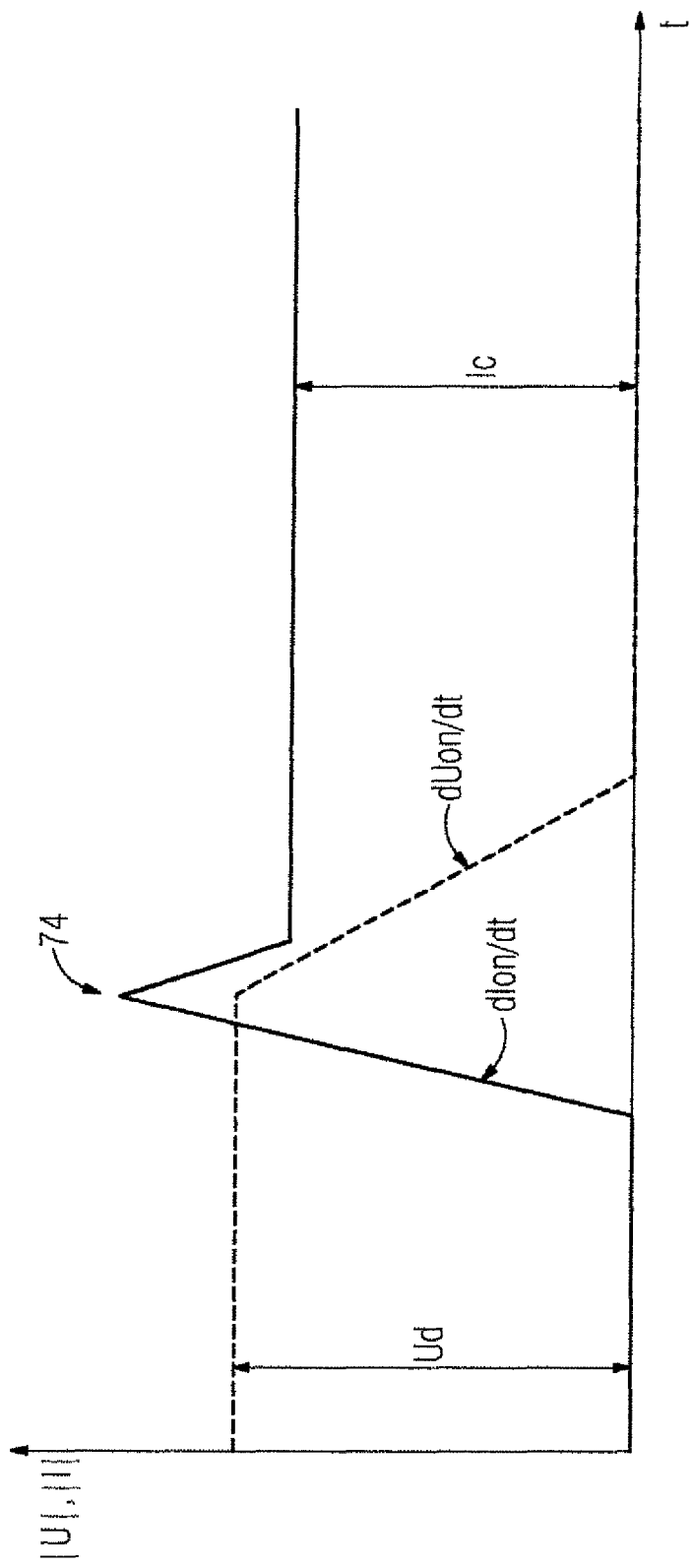
FIG. 4 shows a diagram in which it is possible to see the influence, on a turn-on action, of switching parameters which can be set by the actuation circuit from FIG. 2.

Reference is now made to FIG. 3 and FIG. 4, to explain the influence, on a switching action, of setting switching parameters to a specific value.

FIG. 3 shows a profile of the current strength of the current Ic and of the voltage Ud during a turn-off action. In order to interrupt the current Ic, its current strength is gradually reduced such that the temporal profile of the current strength during the switching action has a finite gradient. A gradient dIoff/dt (dissipation of Ic over time during the turn-off) represents a switching parameter in this case. This gradient corresponds to the switching speed at which the switching action is performed.

By establishing a specific parameter value of the switching parameter for the gradient dIoff/dt in the control device 56, it is predefined in the example shown that, during the turn-off, the current strength of the current Ic should satisfy the condition that the magnitude of the gradient dIoff/dt must not be greater than the parameter value which has been set. This condition therefore represents a criterion that must be satisfied during the switching action. A corresponding control algorithm or an adjustment algorithm with a closed control loop can be provided in the control device 56 in order to ensure that the condition is met.

A maximal voltage value Uce,max of the collector-emitter voltage Uce represents a second switching parameter, which must not be exceeded. The gradient dUoff/dt of the diode voltage Ud can be predefined as a third switching parameter. The profile of the voltage Ud exhibits a rise 72 during the turn-off action, said rise being caused by a voltage which is generated by an inductance (not shown in FIG. 2) when the current Ic is turned off. The maximal value of the rise 72, i.e. the maximal voltage value Uce,max, can be influenced by setting values of the switching parameters for Uce,max and/or dUoff/dt.

Details corresponding to those in FIG. 3 are given in FIG. 4 for a turn-on action. A temporal profile of the diode voltage Ud and the current strength of the current Ic are again shown. Provision can be made whereby a gradient dIon/dt of the current strength of the current Ic and/or a gradient dUon/dt can be predefined by the control device 56 via switching parameters. The profile of the diode current Ic exhibits a peak 74, which is caused by the reverse current behavior of the decommutated freewheeling diode. A maximal value of the current peak 74 can be influenced by setting values of the switching parameters.

The maximal voltage value Uce,max and the gradients dIon/dt, dUon/dt, dIoff/dt and dUoff/dt represent operating variables of the semiconductor circuit breaker 44. In the following, the same designations are used for the switching parameters of the control device 56 as for the operating variables which they influence. Therefore switching parameters Uce,max, dIon/dt, dUon/dt, dIoff/dt and/or dUoff/dt may be provided. However, switching parameters need not be provided in the control device 56 for all of the described operating variables.

Figure 5:
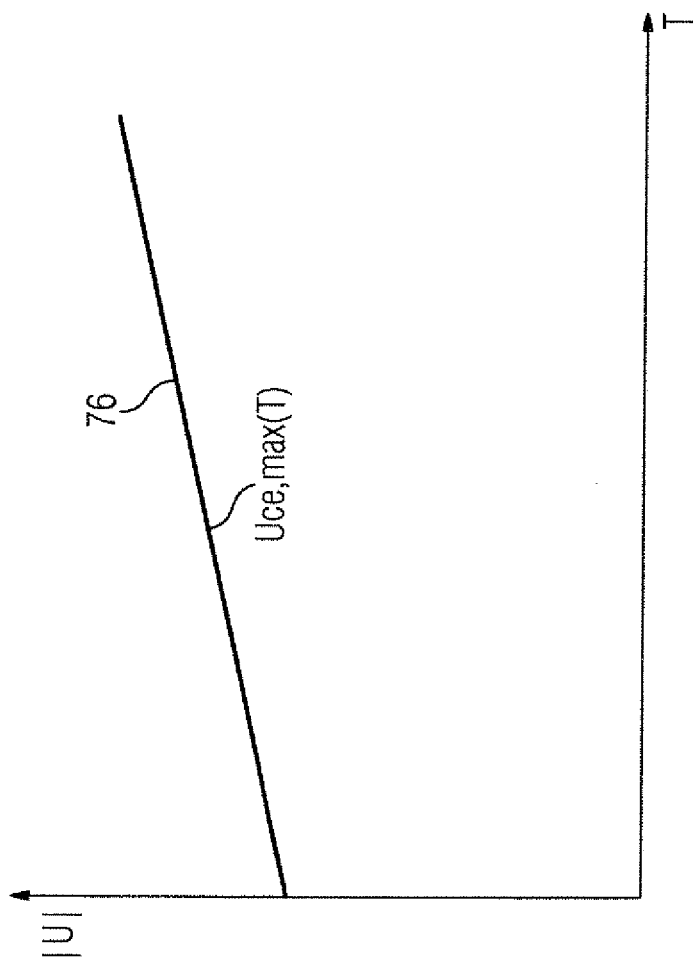
FIG. 5 shows a diagram illustrating a relationship between a temperature of the semiconductor circuit breaker from FIG. 2 and its highest permitted blocking voltage.

FIG. 5 shows a characteristic curve 76 which describes a dependency of a maximal permitted blocking voltage Uce,max(T) on a temperature T of the transistor 46. According to the characteristic curve 76, the blocking ability of the transistor 46 decreases with the temperature T. For example, the characteristic curve 76 can take the form of a metrologically-determined value table or a mathematical function.

By introducing the digital control device 56, it is possible to influence the switching of the transistor 44 depending on its temperature T and its switching properties online, i.e. during operation. It is therefore not necessary to design the IGBT actuation for a particularly unfavorable condition (worst case). A worst-case condition can occur if the current Ic must be switched at a very low temperature, for example. In addition to a lower permitted maximal voltage (see FIG. 5), the semiconductor circuit breaker 44 also exhibits varied switching behavior at low temperatures and, in conjunction with stray inductances, this can result in a higher voltage load. As a result of adapting the switching parameters to the actual operating state of the semiconductor circuit breaker 44, the switching losses can be reduced and the use of the semiconductor circuit breaker 44 (e.g. its service life) increased.

FIG. 6 to FIG. 11 show further circuit arrangements comprising an actuation circuit and a semiconductor circuit breaker in each case. In the figures, elements which function in the same way as elements in FIG. 2 are denoted by the same reference signs as in FIG. 2. These elements are not explained again in the following.

Figure 6:
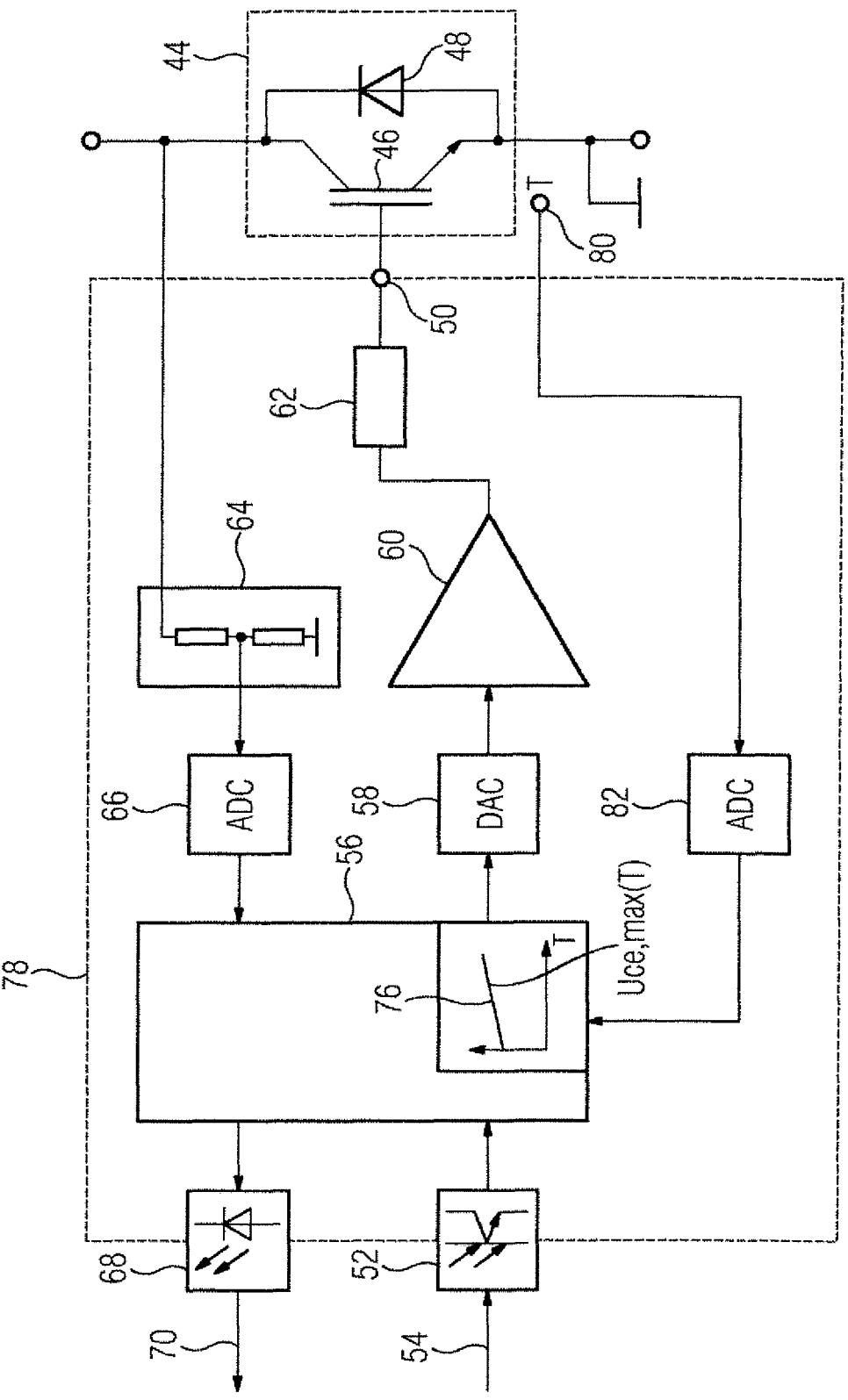
FIGS. 6 to 11 show a schematic illustration in each case of an actuation circuit and a semiconductor circuit breaker, these together forming a further embodiment of the inventive circuit arrangement in each case.

FIG. 6 shows an actuation circuit 78 which is connected to a temperature sensor 80. The temperature sensor 80 measures a temperature T of a semiconductor circuit breaker 44. In the example shown, the temperature may relate to a transistor 46 or a diode 48 of the semiconductor circuit breaker 44. The temperature sensor 80 can be arranged e.g. on a heat sink of the semiconductor circuit breaker 44 or within the semiconductor circuit breaker 44. A measured value from the temperature sensor 80 is converted by an analog-digital converter 82 into a digital measured value, which is taken into consideration by a control device 56 when generating a control voltage as an operating variable for controlling the semiconductor circuit breaker 44.

A characteristic curve 76 such as that illustrated in FIG. 5 is stored in the control device 56. With reference to the characteristic curve 76, a value for the maximal permitted blocking voltage Uce,max(T) is determined as a function of the temperature T. The value determined is set as a parameter value for a switching parameter Uce,max of the control device 56.

Figure 7:
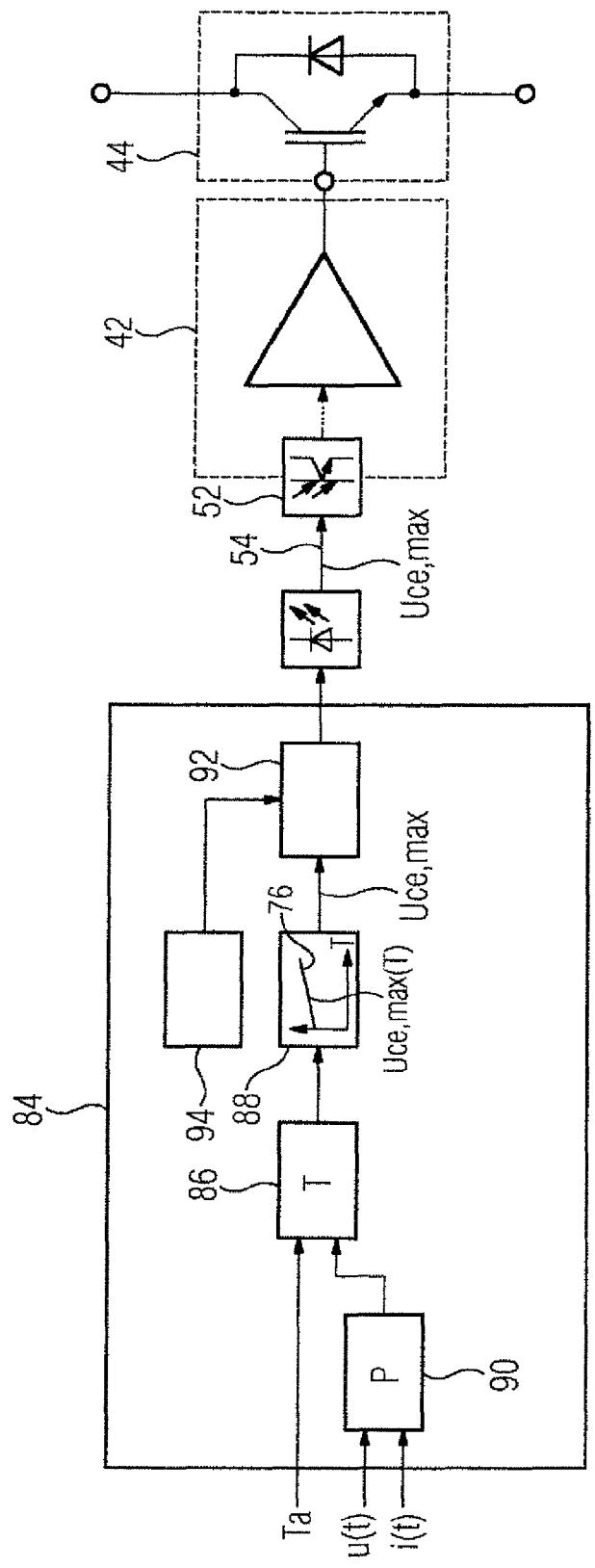

FIG. 7 shows a converter controller 84 which sends a switching signal via a control line 54 to an actuation circuit that corresponds to the actuation circuit 42 already shown in FIG. 2. The converter controller 84 represents a signal generating device. It sends the switching signal together with a parameter value for the switching parameter Uce,max. The parameter value is determined using a numeric model 86. A momentary temperature T of a semiconductor circuit breaker 44 can be calculated by the model 86. The parameter value is specified by the converter controller 84 on the basis of the calculated temperature T by means of a characteristic curve 76 (see FIG. 5). The characteristic curve 76 is stored in a characteristic curve memory 88.

The numeric model 86 requires an input parameter in the form of an initial temperature Ta as exhibited by the semiconductor circuit breaker 44 at operational startup of the converter. A further input parameter consists of a power P which has been converted in the semiconductor circuit breaker 44 since operational startup. The power P is determined in a calculation unit 90 from time profiles of an operating voltage u(t) and an operating current i(t), which have been supplied by the converter by means of the semiconductor circuit breaker 44 since operational startup at a connection interface (not shown).

A communication unit 92 transmits the parameter value determined via the control line 54 together with an actual switching signal which is generated by the clock generating device 94. Further parameter values are also transmitted to further actuation circuits (not shown) of the converter via control lines which are not shown in FIG. 7. The values for the switching parameters can be transmitted using a fault-tolerant transmission protocol to the individual actuation circuits of the converter, where they are accepted into programmable control devices as parameter values in the programmable control devices.

A measurement of the temperature inside the converter can also be used instead of the temperature model.

Figure 8:
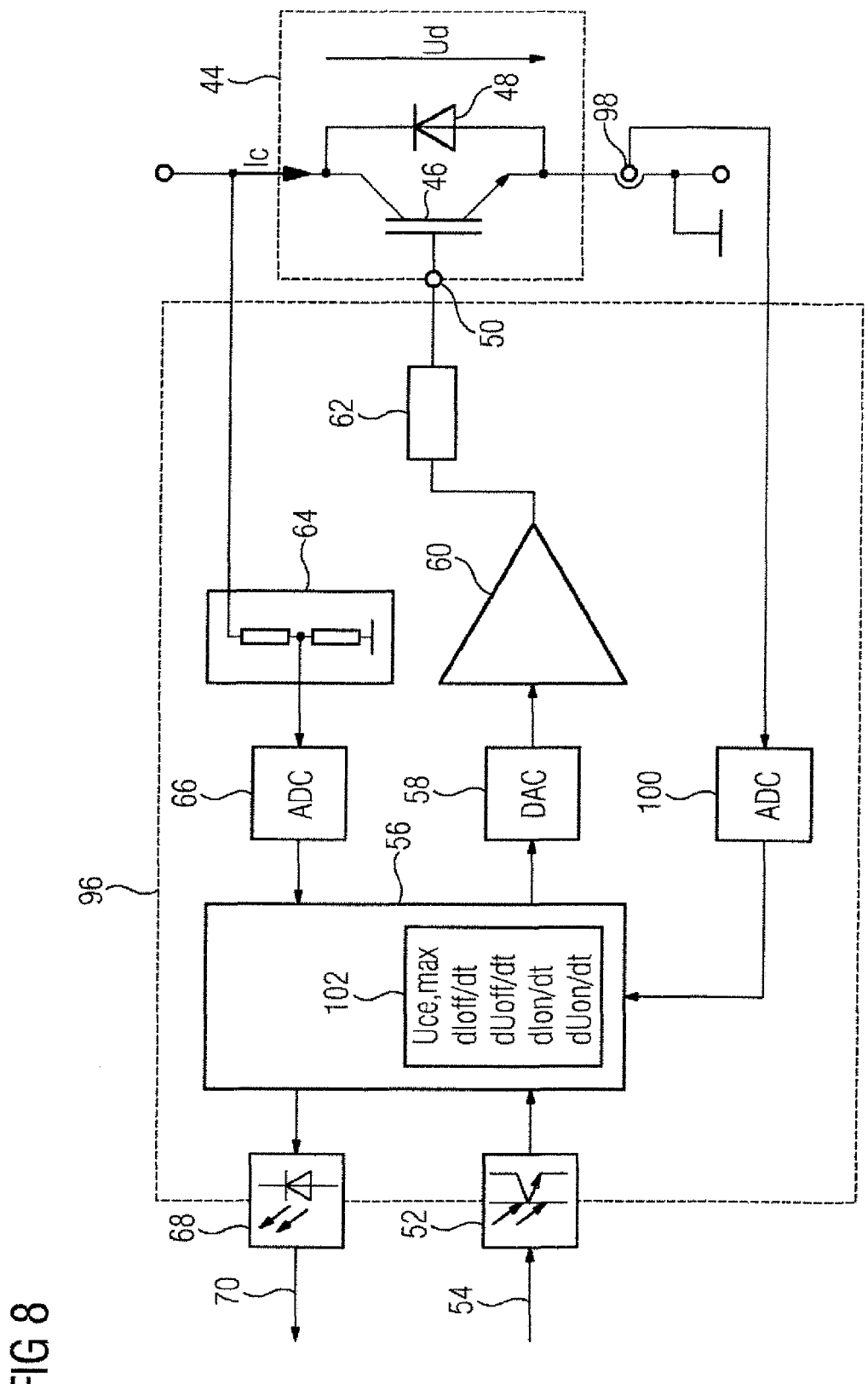

FIG. 8 shows an actuation circuit 96 to which a current converter 98 is connected. The current converter 98 measures a current strength of a current Ic to be switched. A measured value from the current converter 98 is converted here by an analog-digital converter 100 of the actuation circuit 96 into a digital measured value, which is taken into consideration by a control device 56 when generating a control voltage as an operating variable for controlling a semiconductor circuit breaker 44. In the context of the semiconductor circuit breaker 44, the types of transistor 46 and diode 48 which are installed can under certain operating conditions result in increases such as a rise 72 (FIG. 3) when blocking or a peak 74 (FIG. 4) when closing the semiconductor circuit breaker 44. This may be due to an interruption in current or voltage, for example, i.e. a sudden change in the magnitude of these variables. This behavior is restricted to very few operating points, however. With reference to a measurement of the current Ic by means of the current converter 98 and to a measurement of a diode voltage Ud by means of a voltage measuring device 64, it is already possible before an actual switching action to determine in advance whether such an operating point is present. In other words, the operating state of the semiconductor circuit breaker 44 can be determined by measuring the operating variables Ic and Ud, and switching parameters of the control device 56 can be established in advance accordingly. In the example shown in FIG. 8, parameter values for switching parameters Uce,max, dIoff/dt, dUoff/dt, dIon/dt and dUon/dt can be determined on the basis of the measured values for the diode voltage Ud and the current strength of the current Ic to be switched. The most suitable parameter values for the respective operating state are stored in a table 102 within the control device 56 here.

Figure 9:
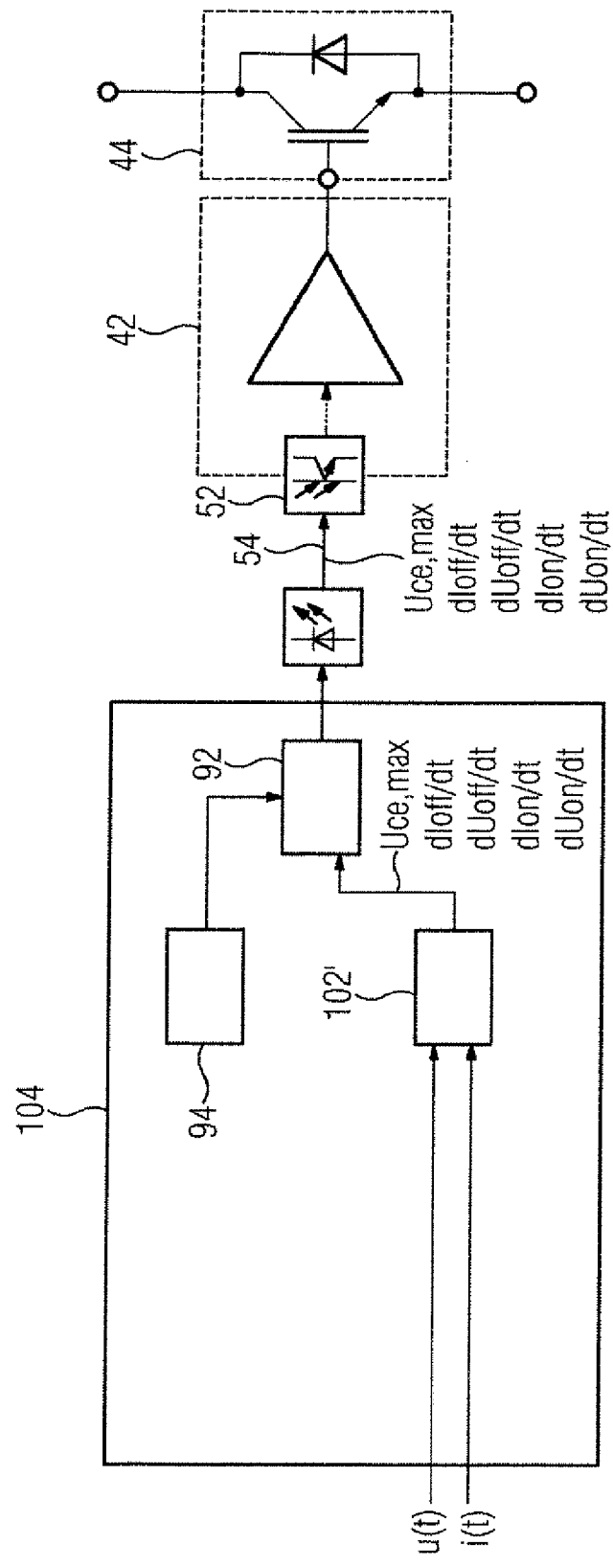

FIG. 9 shows a converter controller 104 of a converter (not illustrated in detail), said converter controller 104 having a table 102' by means of which, in a similar way to the table 102, parameter values for switching parameters of an actuation circuit 42 can be determined. The parameter values determined are transmitted together with a switching signal from a clock generating device 94 by a communication unit 92 to the actuation circuit 42 (and to further actuation circuits which are not illustrated) in the manner described in the context of FIG. 7. By virtue of the table 102', the determination of the parameter values can take place on the basis of a current operating state, this being determined with reference to measurements of time profiles of an operating voltage u(t) and an operating current i(t).

Figure 10:
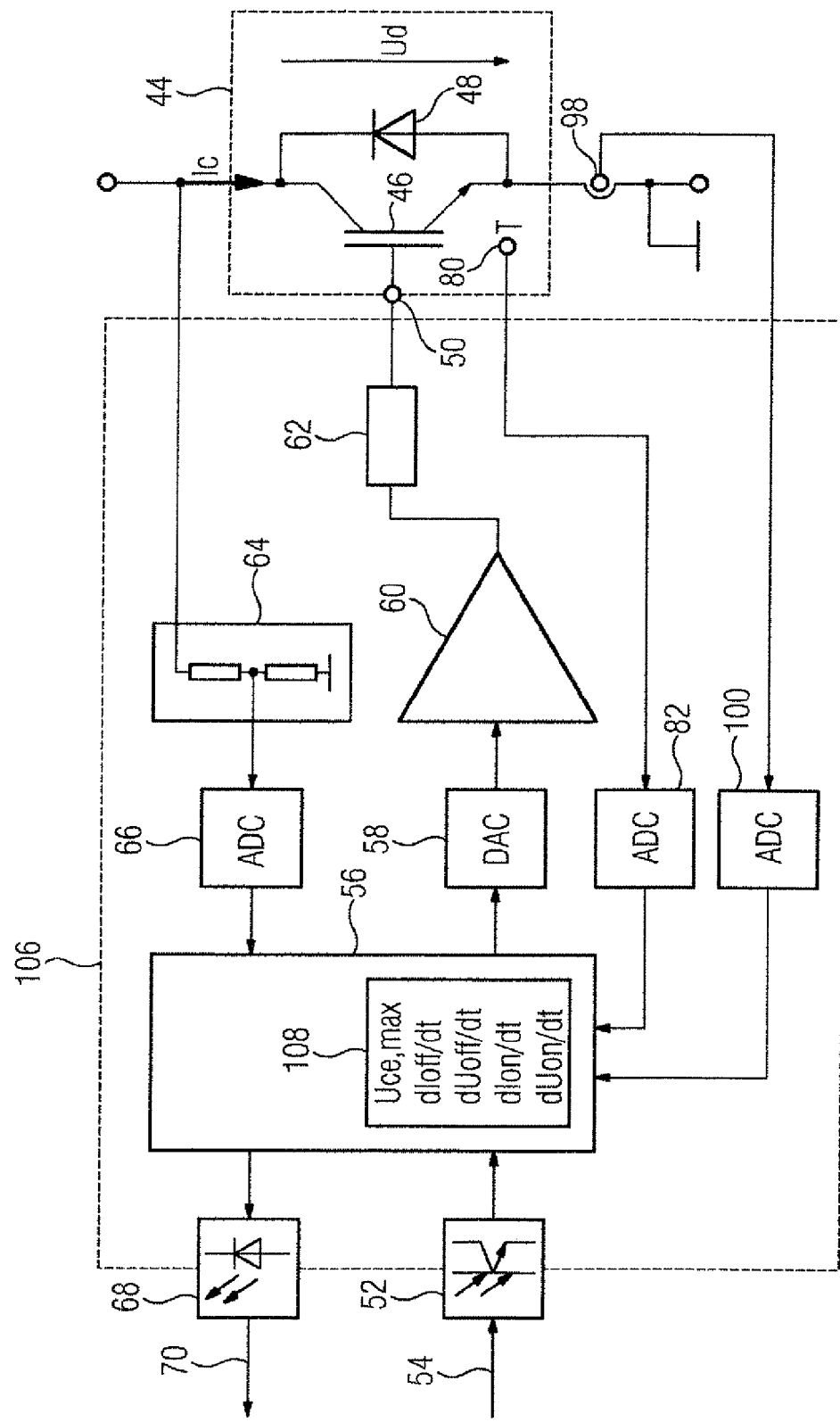

FIG. 10 shows an actuation circuit 106 in which switching parameters Uce,max, dIoff/dt, dUoff/dt, dIon/dt, dUon/dt of a control device 56 are determined as a function of three operating variables of a semiconductor circuit breaker 44, namely a current Ic, a diode voltage Ud and a temperature T of a semiconductor circuit breaker 44. The temperature T of the semiconductor circuit breaker 44 is captured, and the permitted temperature-dependent switching speed dIoff/dt, dIon/dt is specified from an existing metrologically-determined table 108 as a function of the current Ic and the voltage Ud and established as a parameter value of the switching parameters dIoff/dt, dIon/dt. The values of the remaining switching parameters Uce,max, dUoff/dt and dUon/dt are likewise established with reference to the table and as a function of the current operating state.

Figure 11:
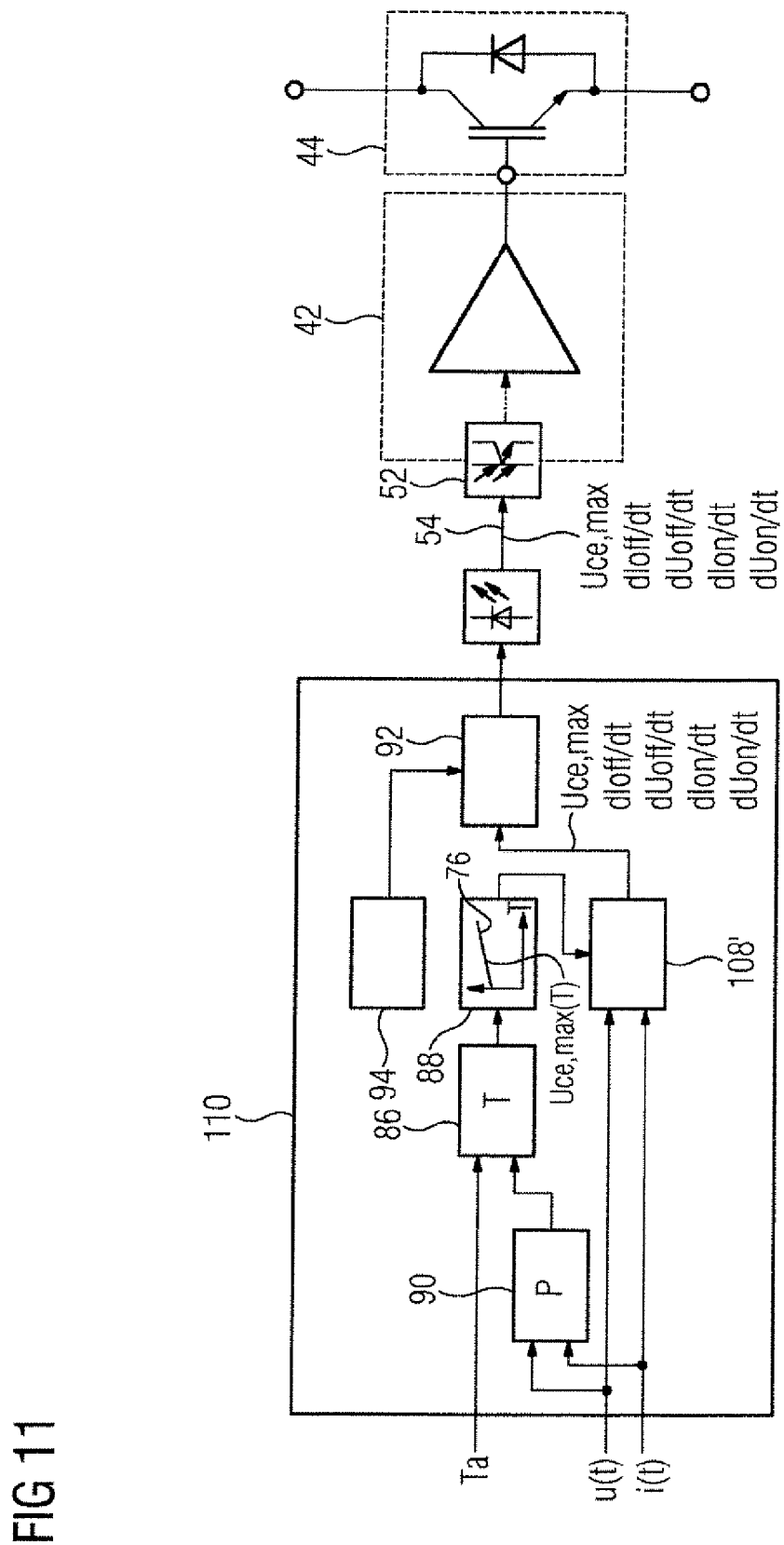

FIG. 11 shows a converter controller 110 which determines switching parameters Uce,max, dIoff/dt, dUoff/dt, dIon/dt, dUon/dt in a way which is also possible using the control device 56 of the actuation circuit 106. Instead of a temperature measurement, provision can be made for using a numeric model 86 here. On the basis of the determined operating state of a semiconductor circuit breaker 44, the parameter values for the switching parameters Uce,max, dIoff/dt, dUoff/dt, dIon/dt, dUon/dt are determined with reference to a table 108' and transmitted to an actuation circuit 42.

The examples show how a digitally programmable actuation circuit can be used to allow switching parameters to be reconfigured or varied during the operation of a converter. This means that the permitted maximal voltage in the switching operation can be influenced online as a function of the temperature in order to reduce the switching losses. Equally, it allows the turn-on and turn-off parameters to be influenced online as a function of current and voltage. Parameter values for influencing the switching behavior can be transmitted together with a switching signal in an encoded manner. The transmission of parameter values can be effected by means of a fault-tolerant transmission protocol in this case.

It can therefore be ensured that switching losses of a semiconductor circuit breaker 44 remain constant over a wide range of possible operating temperatures of the semiconductor circuit breaker 44. Since the switching speed no longer has to be adapted to the lowest temperature value (worst case) in order to limit any overvoltages that may arise (see FIG. 5), it is possible to achieve a significantly higher speed at higher temperatures and hence to reduce the power loss.

What is claimed is:

1. A circuit arrangement for switching a current as a function of a predetermined switching signal, comprising:
   a semiconductor circuit breaker for switching the current,
   an actuation device configured to receive the switching signal and to generate at a control input of the semiconductor circuit breaker as a function of the received switching signal a control voltage having a temporal profile, wherein the temporal profile causes switching between a conducting state and a blocking state of the semiconductor circuit breaker that is not abrupt and not permanent during a switching action and instead at least one predetermined operating variable selected from a maximum collector-emitter voltage (Uce,max), a maximum slope of the current during switch-off (dIoff/dt), a maximum slope of a diode voltage during switch-off (dUoff/dt), a maximum slope of the current during switch-on (dIon/dt), and a maximum slope of a diode voltage during switch-on (dUon/dt) of the semiconductor circuit breaker satisfies a predetermined criterion predefined by an associated switching parameter of the actuation device having a parameter value that can be varied during operation of the circuit arrangement, wherein the actuation device is further configured to receive a digital signal via a switching input using a fault-tolerant transmission protocol or to transmit a digital signal via a measuring output using a fault-tolerant transmission protocol, or both, and a measuring device for measuring at least one of the following operating variables describing an operating state of the semiconductor circuit breaker:

a temperature of a transistor of the semiconductor circuit breaker or a temperature of a diode of the semiconductor circuit breaker, said diode being antiparallel connected to the transistor, wherein a blocking ability and a switching behavior of the semiconductor circuit breaker depend on the temperature and wherein the circuit arrangement is configured to predefine a limit value for a voltage drop across the semiconductor circuit breaker based on the temperature;

a magnitude of a current flowing through the semiconductor circuit breaker, wherein the circuit arrangement is configured to determine, based on the measured magnitude of the current, whether there is a risk of an unacceptably high voltage occurring when the semiconductor circuit breaker is rapidly blocked or rapidly opened; and a voltage drop across the semiconductor circuit breaker, wherein the circuit arrangement is configured to determine how close the voltage drop across the semiconductor circuit breaker has come to a maximum permitted blocking voltage and consequently a maximum permitted value of an induced voltage.

2. The circuit arrangement of claim 1, wherein by establishing the parameter value, a criterion can be predefined for at least one of the following operating variables:

a voltage drop across at least a transistor and a diode of the semiconductor circuit breaker, a gradient of a temporal profile of the voltage drop, a gradient of a temporal profile of the current to be switched, and an time-averaged value of one of the operating variables.

3. The circuit arrangement of claim 1, wherein the parameter value defines a limit value or a desired value for the at least one operating variable.

4. The circuit arrangement of claim 1, wherein the measuring device is configured to measure a time-averaged value of the at least one operating variable.

5. The circuit arrangement of claim 2, wherein the actuation device is configured to automatically establish the parameter value as a function of an operating state of the semiconductor circuit breaker.

6. The circuit arrangement of claim 2, wherein the actuation device is configured to automatically establish the parameter value with reference to a characteristic curve.

7. The circuit arrangement of claim 2, wherein the actuation device is configured to receive the parameter value for a predetermined operating variable together with the switching signal via a control line.

8. A method for controlling a semiconductor circuit breaker with a switching signal generated by a signal generating device and by a control voltage generated by an actuation device, comprising:

determining an operating state of the semiconductor circuit breaker and establishing at least one parameter value of a switching parameter of the actuation device, which defines a criterion for at least one operating variable of the semiconductor circuit breaker during a switching operation of the semiconductor circuit breaker;

generating the switching signal and transmitting the switching signal to the actuation device;

receiving the switching signal by the actuation device and generating a control voltage at a control input of the semiconductor circuit breaker as a function of the switching signal, wherein a temporal profile of a voltage value of the control voltage is defined such that, during the switching operation, the at least one operating variable satisfies the criterion defined by the parameter value, receiving a digital signal via a switching input of the actuation device using a fault-tolerant transmission protocol or transmitting a digital signal via a measuring output of the actuation device using a fault-tolerant transmission protocol, or both wherein at least one of the following operating variables describing an operating state of the semiconductor circuit breaker is measured or determined based on a numeric model as a function of at least one other operating variable:

a temperature of a transistor of the semiconductor circuit breaker or a temperature of a diode of the semiconductor circuit breaker, said diode being antiparallel connected to the transistor, wherein based on the temperature a limit value for a voltage drop across the semiconductor circuit breaker is defined;

a magnitude of a current flowing through the semiconductor circuit breaker, wherein it is determined, based on the measured magnitude of the current, whether there is a risk of generating an unacceptably high voltage when the semiconductor circuit breaker is rapidly blocked or rapidly opened; and a voltage drop across the semiconductor circuit breaker, wherein it is determined how close the voltage drop across the semiconductor circuit breaker has already come to a maximum permitted blocking voltage and consequently a maximum permitted value of an induced voltage.

9. The method of claim 8, wherein a time-averaged value is determined for one of the operating variables.

10. The method of claim 8, wherein by establishing the parameter value of a switching parameter, a desired value or a limit value for one of the following operating variables is predefined for a switching operation:

a voltage drop across at least a transistor and a diode of the semiconductor circuit breaker, a gradient of a temporal profile of the voltage drop, a gradient of a temporal profile of the current to be switched, and an time-averaged value of one of the operating variables.

11. The method of claim 8, wherein a temperature of the semiconductor circuit breaker is determined based on a numeric model as a function of the at least one other operating variable.

* * * * *